United States Patent
Ha et al.

(10) Patent No.: US 7,915,724 B2
(45) Date of Patent: Mar. 29, 2011

(54) INTEGRATED CIRCUIT PACKAGING SYSTEM WITH BASE STRUCTURE DEVICE

(75) Inventors: Jong-Woo Ha, Seoul (KR); Koo Hong Lee, Seoul (KR); Soo Won Lee, AnYang-Si (KR); JuHyun Park, Seoul (KR); Zigmund Ramirez Camacho, Singapore (SG); Jeffrey D. Punzalan, Singapore (SG); Lionel Chien Hui Tay, Singapore (SG); Jairus Legaspi Pisigan, Singapore (SG)

(73) Assignee: Stats Chippac Ltd., Singapore (SG)

( * ) Notice: Subject to any disclaimer, the term of this patent is extended or adjusted under 35 U.S.C. 154(b) by 636 days.

(21) Appl. No.: 11/864,826

(22) Filed: Sep. 28, 2007

(65) Prior Publication Data

US 2009/0085178 A1    Apr. 2, 2009

(51) Int. Cl.
*H01L 23/02*    (2006.01)
*H01L 23/42*    (2006.01)

(52) U.S. Cl. ........ 257/686; 257/778; 257/787; 257/784; 257/E23.169; 438/109; 438/127; 438/617

(58) Field of Classification Search .............. 257/686, 257/778, E23.169; 438/109, 127, 617
See application file for complete search history.

(56) References Cited

U.S. PATENT DOCUMENTS

| | | | |
|---|---|---|---|
| 5,608,262 A * | 3/1997 | Degani et al. | 257/723 |
| 5,646,826 A * | 7/1997 | Katchmar | 361/704 |
| 5,808,878 A * | 9/1998 | Saito et al. | 361/818 |
| 6,469,376 B2 * | 10/2002 | Vaiyapuri | 257/686 |
| 6,812,567 B2 | 11/2004 | Kim et al. | |
| 6,856,027 B2 | 2/2005 | Wang | |
| 6,921,968 B2 | 7/2005 | Chung | |
| 7,061,121 B2 * | 6/2006 | Haba | 257/777 |
| 2002/0089050 A1 * | 7/2002 | Michii et al. | 257/686 |
| 2004/0212067 A1 | 10/2004 | Wang | |
| 2007/0013038 A1 | 1/2007 | Yang | |
| 2007/0145548 A1 * | 6/2007 | Park et al. | 257/678 |
| 2007/0181989 A1 * | 8/2007 | Corisis et al. | 257/686 |

* cited by examiner

*Primary Examiner* — Nitin Parekh
(74) *Attorney, Agent, or Firm* — Mikio Ishimaru

(57) ABSTRACT

An integrated circuit packaging system including: forming a base structure, having an opening; mounting a base structure device in the opening; attaching an integrated circuit device over the base structure device; and molding an encapsulant on the base structure, the base structure device, and the integrated circuit device.

20 Claims, 10 Drawing Sheets

__US 7,915,724 B2__

INTEGRATED CIRCUIT PACKAGING SYSTEM WITH BASE STRUCTURE DEVICE

TECHNICAL FIELD

The present invention relates generally to integrated circuit packaging, and more particularly to a system for incorporating pre-tested and known good packages in a stacked configuration.

BACKGROUND ART

The electronic industry continues to seek products that are lighter, faster, smaller, multi-functional, more reliable and more cost-effective. In order to meet the requirement of the electronic industry, circuit chips should be more highly integrated. In some practical applications, such as personal audio players, cellular telephones, hand help global positioning systems, and hand held video games, it can be desirable to combine several different types of electronic integrated circuit devices in a single package. Particularly for mobile communications devices, for example, it may be desirable to include in a single package a digital processor, an analog device, and a memory device. However increasing the density of integration of chips may be expensive and have technical limitations.

It is possible to stack one die over another in a stacked die package, although the interconnections of the several die can be complex. Therefore, three-dimensional (3-D) type semiconductor packaging techniques have been developed and used. In general, package stacks made by stacking a plurality of packages and stacked chip packages made by stacking a plurality of chips in a package have been used.

A further challenge for packages having a variety of die types is raised by the fact that not all die are "good", and just one "bad" die in a stacked die package results in a failed package and wasted "good" die. Package stacks may be manufactured by stacking packages that have already passed the necessary tests for their functions. Therefore, the yields and reliability of these package stacks may be higher than those stacked chip packages manufactured by stacking a plurality of chips without being tested. However, the package stacks may be thicker as compared with stacked chip packages, because of the thickness of each individual stacked package.

Thus, a need still remains for an integrated circuit packaging system with thin profile. In view of the technical challenges associated with combining multiple technologies in a single package, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to save costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit packaging system including: forming a base structure, having an opening; mounting a base structure device in the opening; attaching an integrated circuit device over the base structure device; and molding an encapsulant on the base structure, the base structure device, and the integrated circuit device.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
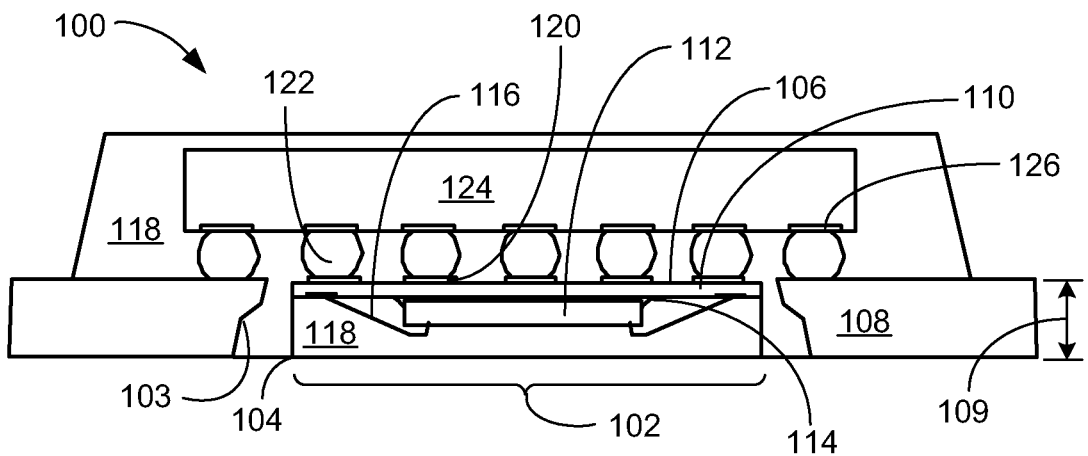
FIG. 1 is a cross-sectional view of an integrated circuit packaging system with thin profile in an embodiment of the present invention.

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGS. Where multiple embodiments are disclosed and described, having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the package substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements.

The term "system" as used herein means and refers to the method and to the apparatus of the present invention in accordance with the context in which the term is used. The term "processing" as used herein includes stamping, forging, patterning, exposure, development, etching, cleaning, and/or removal of the material or laser trimming as required in forming a described structure. The term "device" means a die or package containing a die. The term "thin profile" is used to describe the present invention because a base structure is used to contain one of the devices of the integrated circuit packaging system, which makes the system thin compared to previous packages.

Referring now to FIG. 1, therein is shown a cross-sectional view of an integrated circuit packaging system 100 with thin profile in an embodiment of the present invention. The cross-sectional view of the integrated circuit packaging system 100 depicts a base structure device 102, such as an integrated circuit package. The base structure device 102 has a topside 104 and an interface side 106, mounted within a base structure 108, such as a quad flat no-lead (QFN) lead frame.

The base structure device 102 is so-called because it is substantially in an opening 103 of the base structure 108 and has a thickness equal to or less than the thickness of the base structure 108.

The base structure device 102 may have a substrate 110, such as a flex substrate or a printed circuit board substrate, and an integrated circuit die 112. The integrated circuit die 112 may be attached to the substrate 110 by an adhesive 114, such as a die attach material. Electrical interconnects 116, such as bond wires, couple the integrated circuit die 112 to the substrate 110.

An encapsulant 118, such as an epoxy molding compound, covers the substrate 110, the integrated circuit die 112, the adhesive 114, and the electrical interconnects 116 forming the topside 104 of the base structure device 102.

Interface contacts 120 may be formed on the substrate 110 to establish the interface side 106 of the base structure device 102. The base structure device 102 may be mounted with the topside 104 down allowing the interface contacts 120 to electrically connect to flip chip interconnects 122, such as solder balls, of a device, such as a flip chip die 124. The flip chip interconnects 122 may be coupled to contact pads 126 on the flip chip die 124, the interface contacts 120, the base structure 108, or a combination thereof. The encapsulant 118 may be molded on the flip chip die 124, the flip chip interconnects 122, the base structure device 102, and the base structure 108.

The integrated circuit packaging system 100 may provide a manufacturing technique that allows pre-tested packages to be joined without adding additional height to the standard single die package (not shown). Utilizing known good packages in the manufacturing process may improve the manufacturing yield while providing an efficient manufacturing flow.

Figure 2:
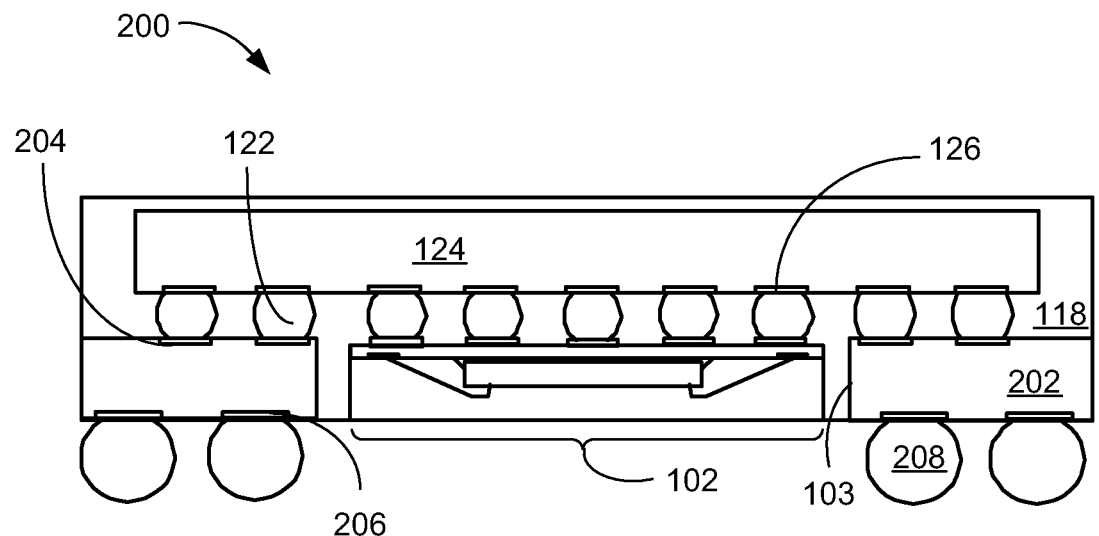
FIG. 2 is a cross-sectional view of an integrated circuit packaging system with thin profile in an alternative embodiment of the present invention.

Referring now to FIG. 2, therein is shown a cross-sectional view of an integrated circuit packaging system 200 with thin profile in an alternative embodiment of the present invention. The cross-sectional view of the integrated circuit packaging system 200 depicts the base structure device 102 coupled to the flip chip interconnects 122 of the flip chip die 124.

A base structure 202, such as a ball grid array (BGA) substrate or a laminate substrate, may be coupled to some of the flip chip interconnects 122 through a chip contact 204 for forming an electrical connection to the contact pads 126. Board pads 206 located on the bottom of the base structure 202 may be coupled to system interconnects 208, such as solder balls, solder columns, solder bumps, or stud bumps, for final connection of the integrated circuit packaging system 200 to a next level system (not shown).

The base structure device 102 may provide a rapid integration method for packaging different technologies in the same single height package. The base structure device 102 may be thinner than the base structure 202 or the base structure 108, of FIG. 1.

Figure 3:
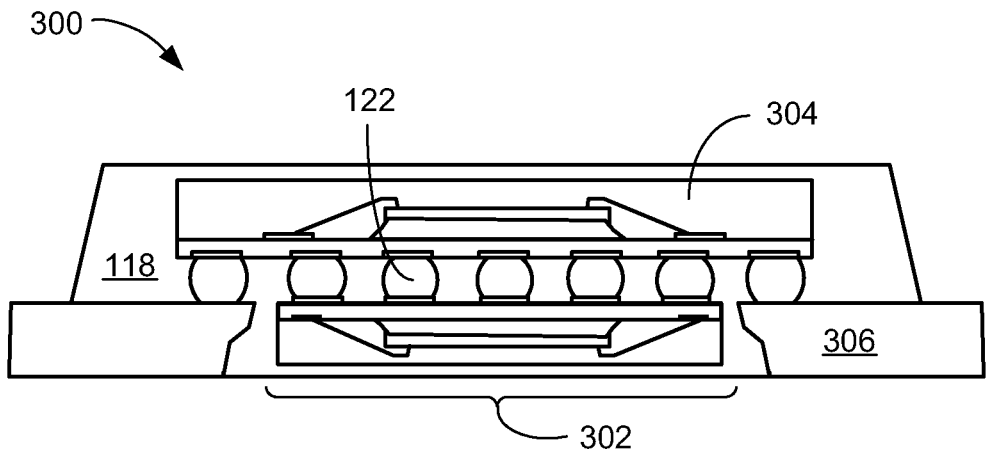
FIG. 3 is a cross-sectional view of a quad flat no-lead (QFN) package in an embodiment of the present invention.

Referring now to FIG. 3, therein is shown a cross-sectional view of a quad flat no-lead (QFN) package 300 in an embodiment of the present invention. The cross-sectional view of the QFN package 300 depicts a base structure device 302 mounted in a topside down position couples to an integrated circuit device 304 by the flip chip interconnects 122. The integrated circuit device 304 may have more of the interface contacts 120 than the base structure device 302. The interface contacts 120 that do not couple to the base structure device 302 may be coupled to a base structure 306 by the flip chip interconnects 122.

The encapsulant 118 may be molded on the base structure device 302, the integrated circuit device 304, the flip chip interconnects 122, and the base structure 306. The base structure device 302 and the integrated circuit device 304 may be constructed in a generally similar fashion to the base structure device 102 of FIG. 1.

Figure 4:
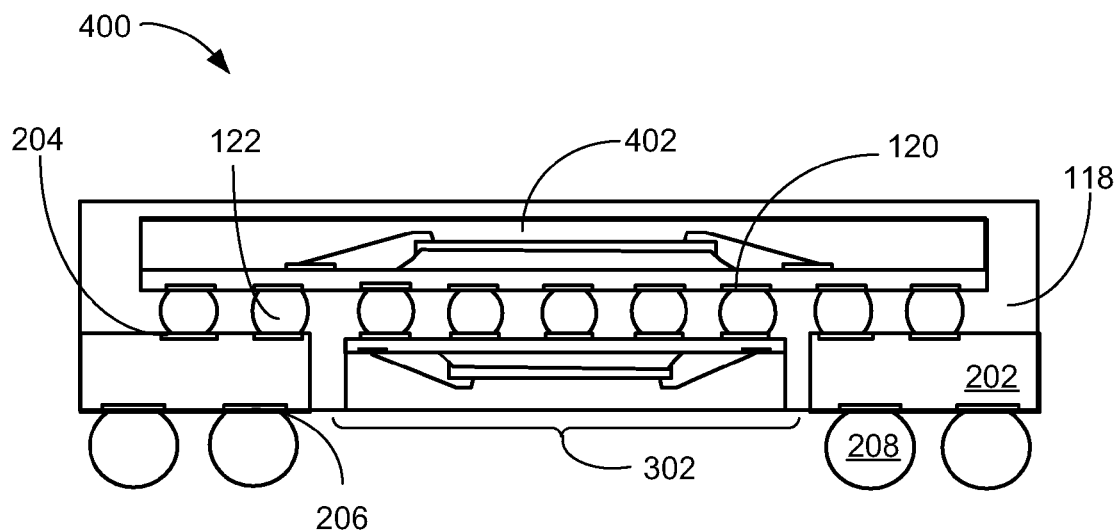
FIG. 4 is a cross-sectional view of a ball grid array (BGA) package in an embodiment of the present invention.

Referring now to FIG. 4, therein is shown a cross-sectional view of a ball grid array (BGA) package 400 in an embodiment of the present invention. The cross-sectional view of the BGA package 400 depicts the base structure device 302 coupled to an integrated circuit device 402 by the flip chip interconnects 122. The integrated circuit device 402 may have more of the interface contacts 120 than the base structure device 302. The interface contacts 120 of the integrated circuit device 402 that do not couple to the base structure device 302 may be coupled to the base structure 202, such as a laminate substrate, by the flip chip interconnects 122.

The base structure 202 may be coupled to some of the flip chip interconnects 122 through the chip contact 204 for forming an electrical connection to the interface contacts 120. The board pads 206 located on the bottom of the base structure 202 may be coupled to the system interconnects 208, such as solder balls, solder columns, solder bumps, or stud bumps, for final connection to the next level system (not shown).

The encapsulant 118 may be molded on the base structure device 302, the integrated circuit device 402, the flip chip interconnects 122, and the base structure 202. The base structure device 302 and the integrated circuit device 402 may be constructed in a generally similar fashion to the base structure device 102 of FIG. 1.

Figure 5:
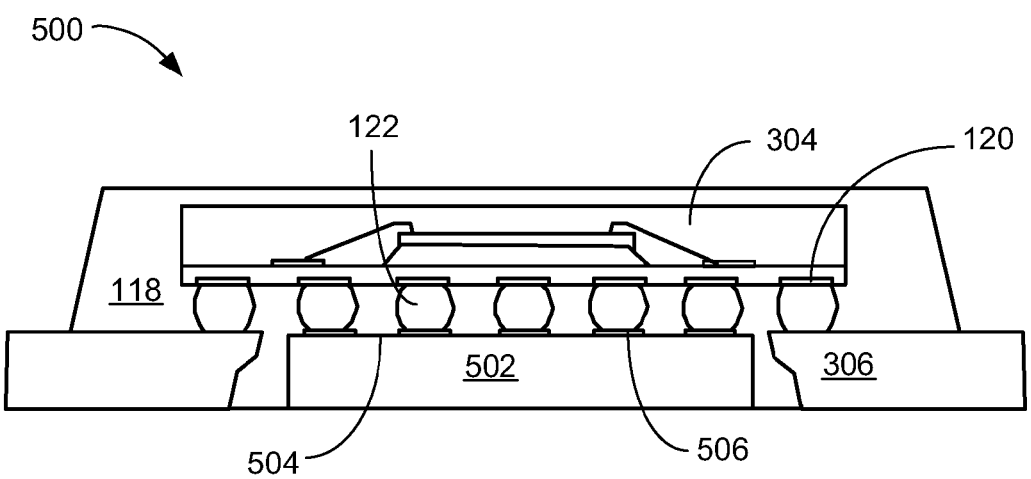
FIG. 5 is a cross-sectional view of a quad flat no-lead package having a flip chip die in an embodiment of the present invention.

Referring now to FIG. 5, therein is shown a cross-sectional view of a quad flat no-lead package 500 having a flip chip die 502 in an embodiment of the present invention. The cross-sectional view of the quad flat no-lead package 500 depicts the flip chip die 502, having an active side 504 with contact pads 506 formed thereon, coupled to the integrated circuit device 304 by the flip chip interconnects 122. The integrated circuit device 304 may have more of the interface contacts 120 than the flip chip die 502 has of the contact pads 506. The interface contacts 120 that do not couple to the flip chip die 502 may be coupled to the base structure 306 by the flip chip interconnects 122.

The encapsulant 118 may be molded on the integrated circuit device 304, the flip chip interconnects 122, the flip chip die 502, and the base structure 306. The base structure device 302 and the integrated circuit device 304 may be constructed in a generally similar fashion to the base structure device 102 of FIG. 1.

Figure 6:
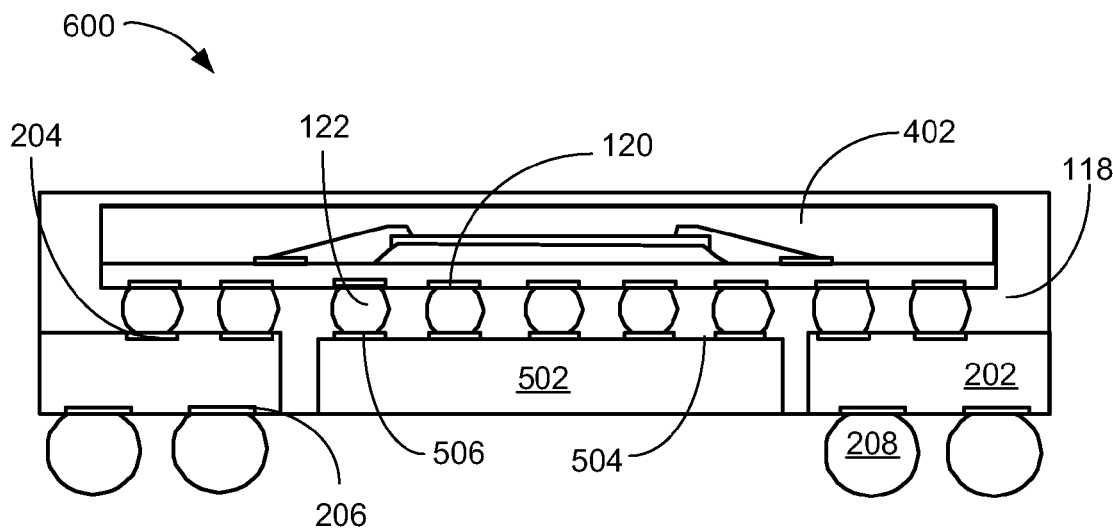
FIG. 6 is a cross-sectional view of a ball grid array package having a flip chip die in an embodiment of the present invention.

Referring now to FIG. 6, therein is shown a cross-sectional view of a ball grid array package 600 having the flip chip die 502 in an embodiment of the present invention. The cross-sectional view of the ball grid array package 600 depicts the flip chip die 502, having the active side 504 with the contact pads 506 formed thereon, coupled to the integrated circuit device 402 by the flip chip interconnects 122. The integrated circuit device 402 may be coupled to the base structure 202, such as a laminate substrate, by the flip chip interconnects 122.

The integrated circuit device 402 may have more of the interface contacts 120 than the flip chip die 502 has of the contact pads 506. The interface contacts 120 that do not couple to the flip chip die 502 may be coupled to the base structure 202 by the flip chip interconnects 122.

The base structure 202 may be coupled to some of the flip chip interconnects 122 through the chip contacts 204 for forming an electrical connection to the interface contacts 120. The board pads 206 located on the bottom of the base structure 202 may be coupled to the system interconnects 208, such as solder balls, solder columns, solder bumps, or stud bumps, for final connection to the next level system (not shown).

The encapsulant 118 may be molded on the integrated circuit device 402, the flip chip interconnects 122, the flip chip die 502, and the base structure 202. The integrated circuit device 402 may be constructed in a generally similar fashion to the base structure device 102 of FIG. 1.

Figure 7:
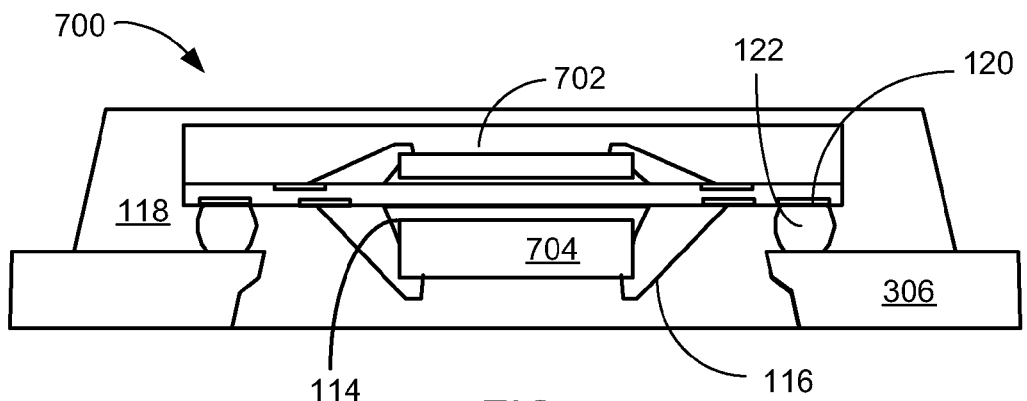
FIG. 7 is a cross-sectional view of a quad flat no-lead package having a base structure device in an embodiment of the present invention.

Referring now to FIG. 7, therein is shown a cross-sectional view of a Quad Flat No-lead package 700 having a base structure device 702 in an embodiment of the present invention. The cross-sectional view of the quad flat no-lead package 700 depicts the base structure device 702 mounted on the base structure 306 by the flip chip interconnects 122. The flip chip interconnect 122 forms an electrical connection between the interface contact 120 and the base structure 306. An integrated circuit die 704 may be mounted to the bottom of the base structure device 702 by the adhesive 114. The electrical interconnects 116 may couple the integrated circuit die 704 to the interface contacts 120 of the base structure device 702.

The encapsulant 118 may be molded on the base structure device 702, the flip chip interconnects 122, the integrated circuit die 704, and the base structure 306. The base structure device 702 may be constructed in a generally similar fashion to the base structure device 102 of FIG. 1.

Figure 8:
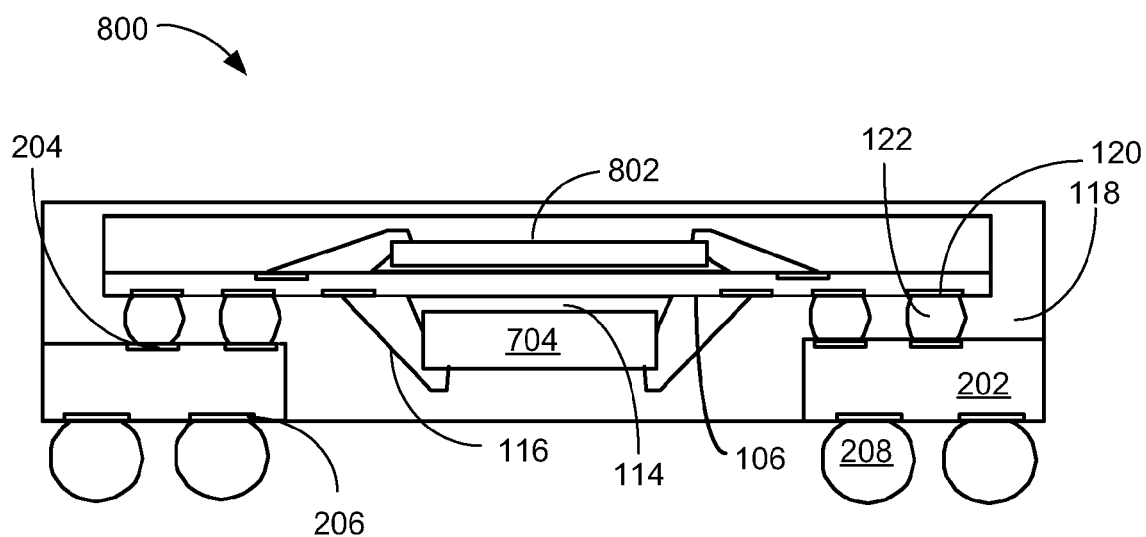
FIG. 8 is a cross-sectional view of a ball grid array package having a base structure device in an embodiment of the present invention.

Referring now to FIG. 8, therein is shown a cross-sectional view of a ball grid array package 800 having a base structure device 802 in an embodiment of the present invention. The cross-sectional view of the ball grid array package 800 depicts the base structure device 802 mounted on the base structure 202 by the flip chip interconnects 122. The flip chip interconnects 122 forms an electrical connection between the interface contacts 120 and the chip contacts 204 of the base structure 202. The integrated circuit die 704 may be attached to the interface side 106 of the base structure device 802 by the adhesive 114. The electrical interconnects 116 may couple the integrated circuit die 704 to the interface contacts 120 of the base structure device 802.

The encapsulant 118 may be molded on the base structure device 802, the flip chip interconnects 122, the electrical interconnects 116, the integrated circuit die 704, and the base structure 202. The base structure device 802 may be constructed in a generally similar fashion to the base structure device 102 of FIG. 1.

The base structure 202 may be coupled to some of the flip chip interconnects 122 through the chip contacts 204 for forming an electrical connection to the interface contacts 120. The board pads 206 located on the bottom of the base structure 202 may be coupled to the system interconnects 208, such as solder balls, solder columns, solder bumps, or stud bumps, for final connection to the next level system (not shown).

Figure 9:
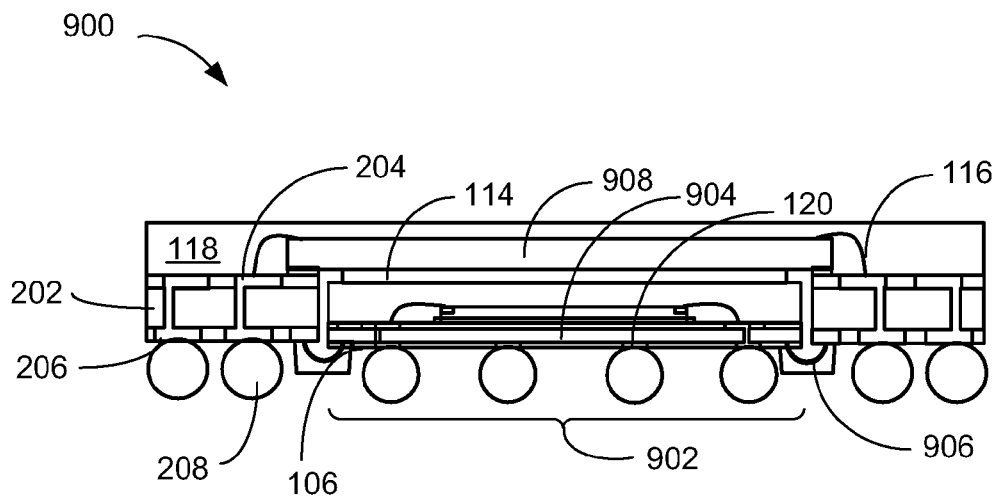
FIG. 9 is a cross-sectional view of a ball grid array package having a base structure device in a BGA mounting.

Referring now to FIG. 9, therein is shown a cross-sectional view of a ball grid array package 900 having a base structure device 902 in a BGA mounting. The cross-sectional view of the ball grid array package 900 depicts the base structure device 902 having a thin substrate 904, such as a laminate substrate, with the interface contacts 120 on the interface side 106 of the base structure device 902. The system interconnects 208 may be formed on the interface contacts 120. Interconnect jumpers 906 may couple the interface contacts 120 of the base structure device 902 to the board pads 206 of the base structure 202.

An integrated circuit die 908 is attached, by the adhesive 114, to the topside 104 of the base structure device 902 and the top of the base structure 202. The electrical interconnects 116 couple the integrated circuit die 908 to the chip contacts 204 of the base structure 202.

The encapsulant 118 encloses the integrated circuit die 908, the base structure device 902, the adhesive 114 and the interconnect jumpers 906.

Figure 10:
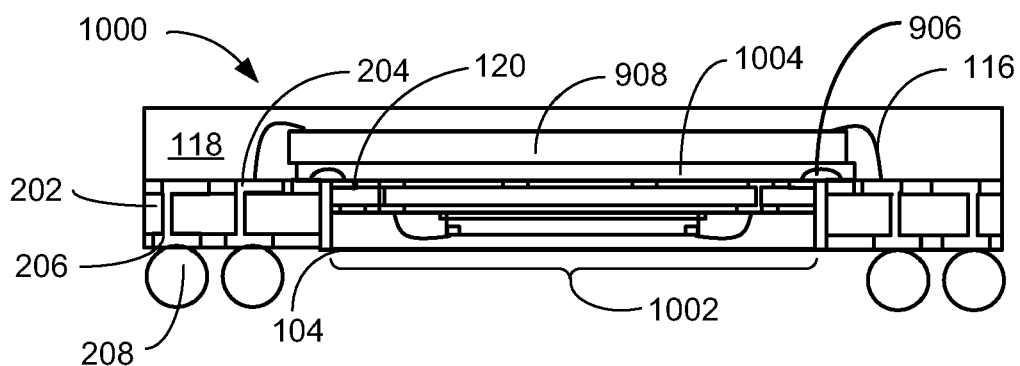
FIG. 10 is a cross-sectional view of a ball grid array package having a base structure device in a top down configuration.

Referring now to FIG. 10, therein is shown a cross-sectional view of a ball grid array package 1000 having a base structure device 1002 in the topside 104 down configuration. The cross-sectional view of the ball grid array package 1000 depicts the base structure device 1002 mounted in the base structure 202. The interconnect jumpers 906 electrically connect the chip contacts 204 with the interface contacts 120.

The integrated circuit die 908 is mounted on a layer of an adhesive material 1004, such as film on wire material, which is on the base structure device 1002. The electrical interconnects 116 may couple the integrated circuit die 908 with the chip contacts 204 on the base structure 202. The encapsulant 118 is molded on the integrated circuit die 908, the electrical interconnects 116, the adhesive material 1004, the chip contacts 204 of the base structure 202, and the base structure device 1002.

The board pads 206 located on the bottom of the base structure 202 may be coupled to the system interconnects 208, such as solder balls, solder columns, solder bumps, or stud bumps, for final connection to the next level system (not shown).

Figure 11:
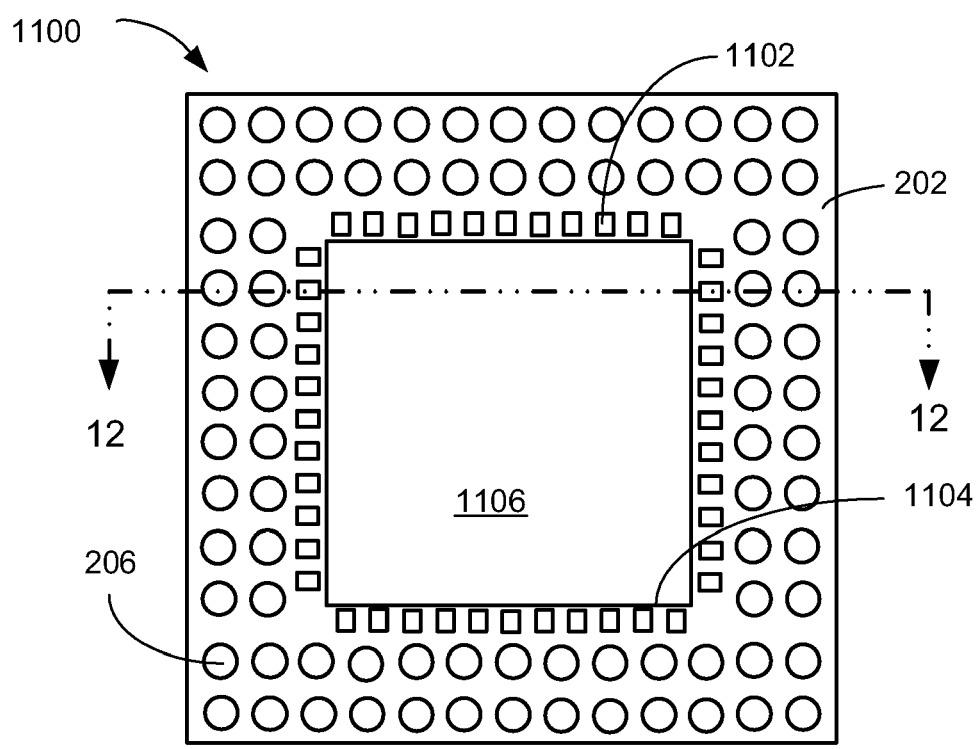
FIG. 11 is a bottom view of a ball grid array assembly in a first molding phase of manufacturing.

Referring now to FIG. 11, therein is shown a bottom view of a ball grid array assembly 1100 in a first molding phase of manufacturing. The bottom view of the ball grid array assembly 1100 depicts the base structure 202 having a double row of the board pads 206, a single row of bonding contacts 1102 and an opening 1104, such as a rectangular opening in the base structure 202. An inactive side 1106 of an integrated circuit die (not shown) may be seen through the opening 1104. A section line 12-12 indicates the view depicted in FIG. 12.

The number, shape, and configuration of the board pads 206 are by way of an example. It is understood that the number, configuration, and shape of the board pads 206 may be different in an actual implementation. In addition, the number, configuration and shape of the bonding contacts 1102 may be different in the actual implementation. The shape and relative size, of the opening 1104, may be different in the actual implementation of this invention.

Figure 12:
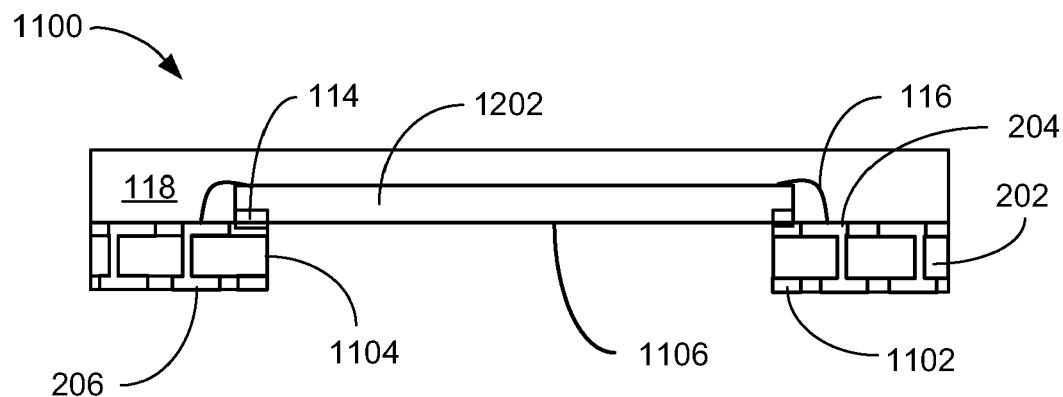
FIG. 12 is a cross-sectional view of the ball grid array assembly along the section line 12-12 of FIG. 11.

Referring now to FIG. 12, therein is shown a cross-sectional view of the ball grid array assembly 1100 along the section line 12-12 of FIG. 11. The cross-sectional view of the ball grid array assembly 1100 depicts the base structure 202 having the board pads 206, the bonding contacts 1102, the opening 1104, and the inactive side 1106 of an integrated circuit die 1202. The integrated circuit die 1202 may be mounted on the base structure 202 by the adhesive 114. The electrical interconnects 116 may couple the integrated circuit die 1202 with the chip contacts 204 on the base structure 202.

The encapsulant 118 is molded on the integrated circuit die 1202, the adhesive 114, the electrical interconnects 116, the chip contacts 204, and the base structure 202.

Figure 13:
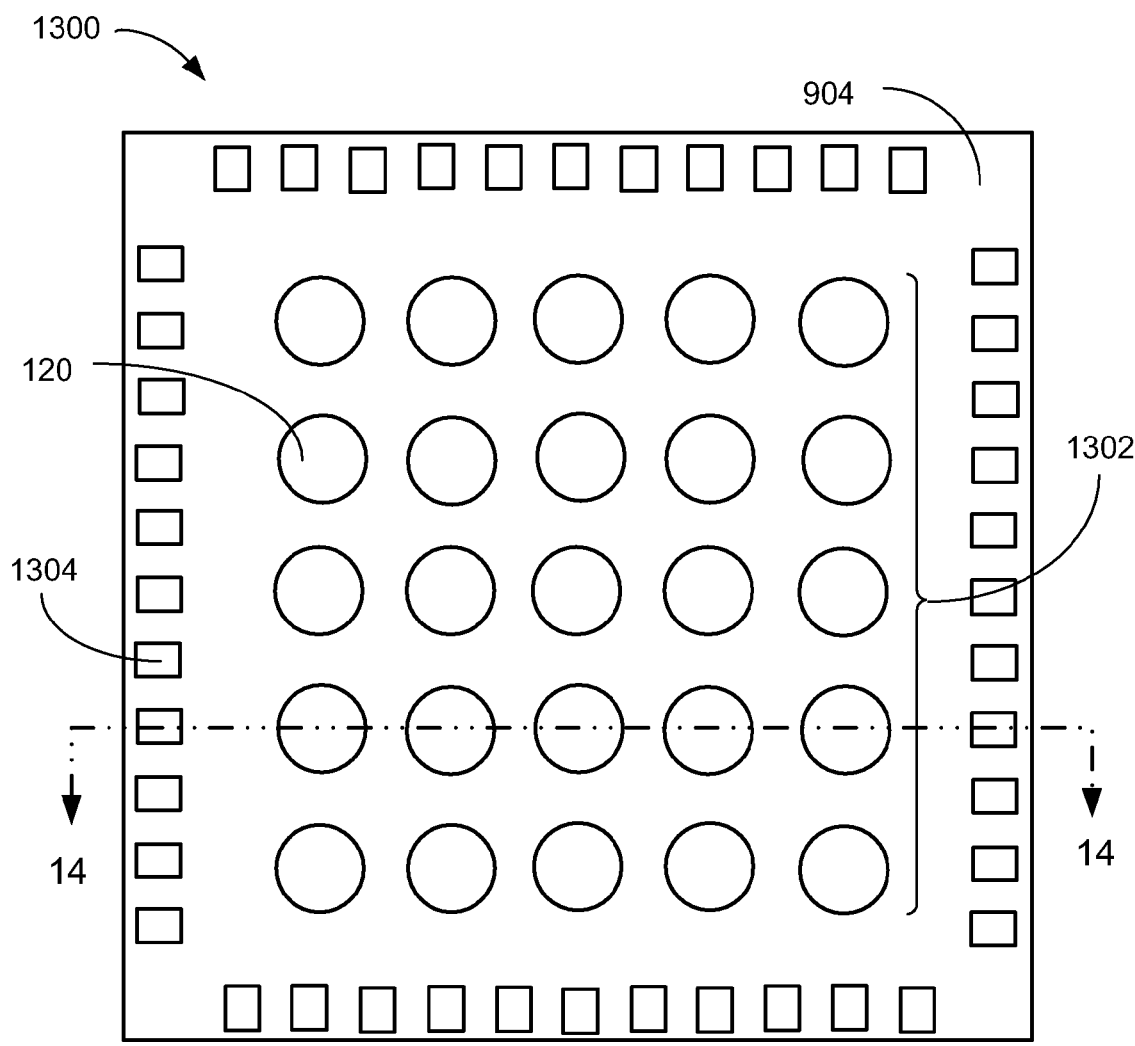
FIG. 13 is a bottom view of a base structure device in a molding phase of manufacturing.

Referring now to FIG. 13, therein is shown a bottom view of a base structure device 1300 in a molding phase of manufacturing. The bottom view of the base structure device 1300 depicts the interface side 106 of the thin substrate 904 having the interface contacts 120 in an array 1302 and jumper pads 1304 aligned along the outer edge of the thin substrate 904. It is understood that the shape of the thin substrate 904 is for example only and the actual shape of the thin substrate 904 may be different. Also, the number of the interface contacts 120 and the shape of the array 1302 are for example only, and the actual shape of the array 1302 and the number of the interface contacts 120 may be different. A section line 14-14 shows the direction of a FIG. 14.

Figure 14:
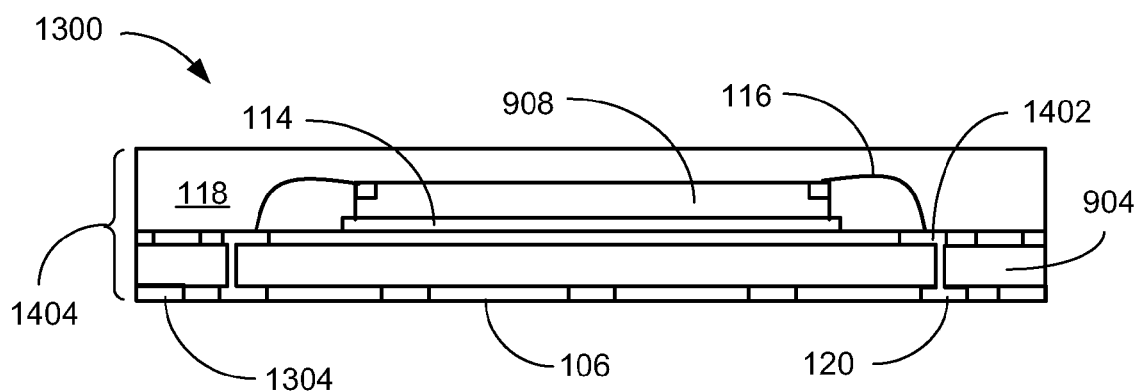
FIG. 14 is a cross-sectional view of the base structure device along the section line 14-14 of FIG. 13.

Referring now to FIG. 14, therein is shown a cross-sectional view of the base structure device 1300 along the section line 14-14 of FIG. 13. The cross-sectional view of the base structure device 1300 depicts the thin substrate 904 having the interface contacts 120 and the jumper pads 1304 on the interface side 106. The integrated circuit die 908 is attached to the thin substrate 904 by the adhesive 114. The electrical interconnects 116 couple the active side of the integrated circuit die 908 to chip bond pads 1402 of the thin substrate 904.

The encapsulant 118 may be molded on the integrated circuit die 908, the electrical interconnects 116, the chip bond pads 1402, and the thin substrate 904. A package thickness 1404 may be in the range of 0.2 to 0.3 millimeters.

The package thickness 1404 may allow the base structure device 1300 to be mounted within the thickness of the base structure 202, of FIG. 2, or the base structure 108, of FIG. 1, without adding additional thickness to the package height. This invention may provide a multiple function package by joining a pre-tested version of the base structure device 1300 with a pre-tested standard packaged device (not shown).

Figure 15:
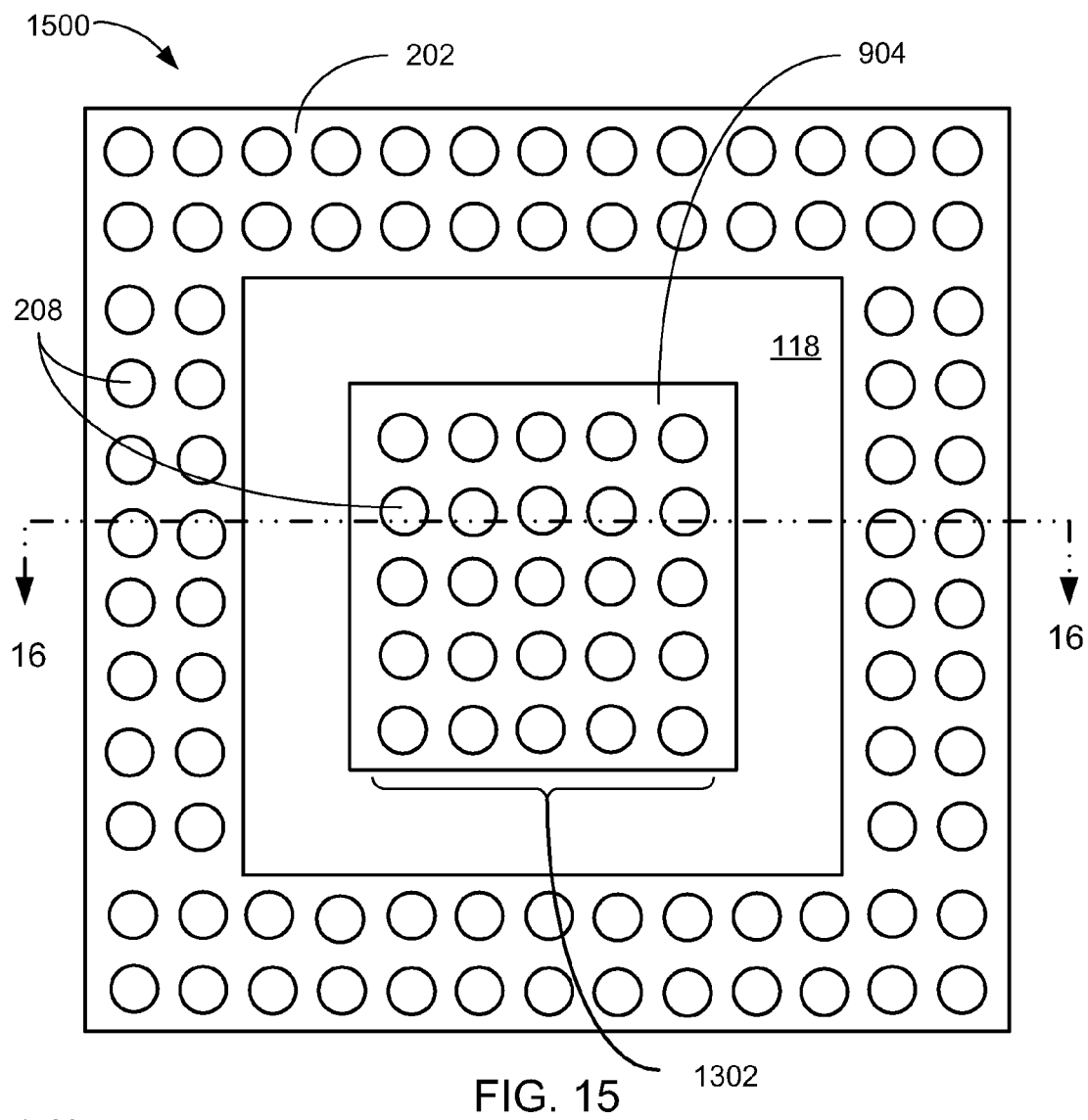
FIG. 15 is a bottom view of a package in package in a second molding phase of manufacturing.

Referring now to FIG. 15, therein is shown a bottom view of a package in package 1500 in a second molding phase of manufacturing. The bottom view of the package in package 1500 depicts the interface contact array 1302 on the thin substrate 904 positioned coplanar with the base structure 202. The encapsulant 118 may be formed in a generally similar shape as the thin substrate 904 and may overlap both the thin substrate 904 and the base structure 202. A section line 16-16 shows the direction of view for a FIG. 16.

The number, shape, and configuration of the system interconnects 208 on the thin substrate 904 and the base structure 202 are only an example. It is understood that the number, shape, and position of the system interconnects 208 may be different.

Figure 16:
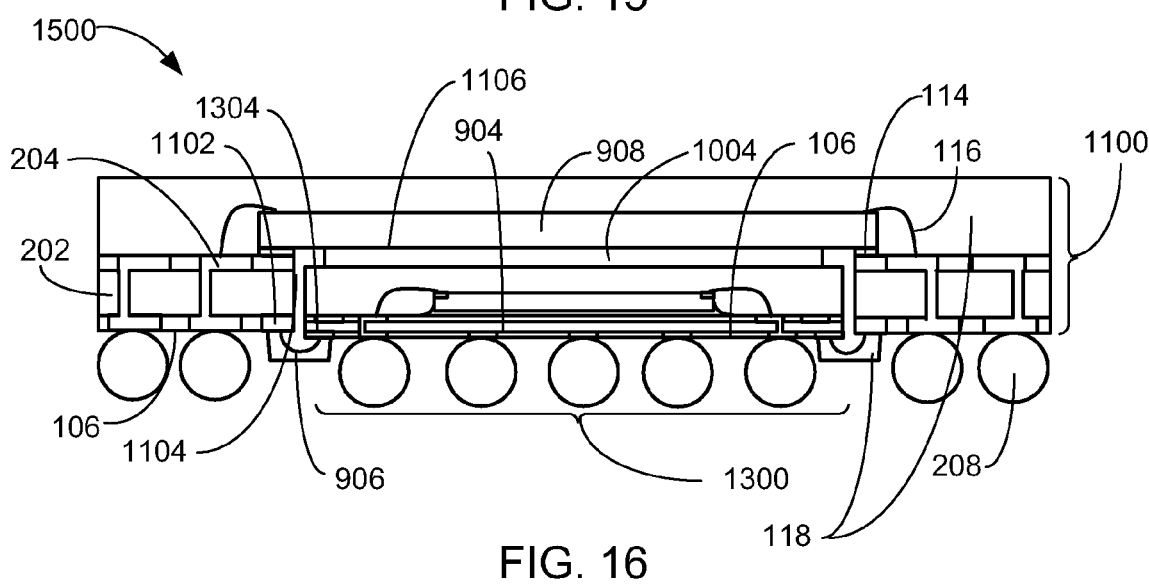
FIG. 16 is a cross-sectional view of package in package along the section line 16-16 of FIG. 15.

Referring now to FIG. 16, therein is shown a cross-sectional view of the package in package 1500 along the section line 16-16 of FIG. 15. The cross-sectional view of the package in package 1500 depicts the base structure 202 having the integrated circuit die 908 mounted thereon by the adhesive 114. The electrical interconnects 116 may couple the integrated circuit die 908 to the chip contacts 204.

The encapsulant 118 may be molded on the integrated circuit die 908, the electrical interconnects 116, the adhesive 114, the chip contacts 204 and the base structure 202. The opening 1104 may be located under the integrated circuit die 908. This portion of the package in package 1500 is the ball grid array assembly 1100.

The base structure device 1300 may be attached to the inactive side 1106 of the integrated circuit die 908 by the adhesive material 1004. The base structure device 1300 may fit into the opening 1104 so the interface side 106 of the base structure device 1300 is coplanar with the interface side 106 of the base structure 202. The interconnect jumpers 906 may electrically connect the jumper pads 1304, of the thin substrate 904, with the bonding contacts 1102, of the base structure 202.

The encapsulant 118 may be molded between the opening 1104 and the base structure device 1300. It is also on the interconnect jumpers 906 and defines a boundary that may be generally similar to the shape of the base structure device 1300, when viewed from the bottom as in FIG. 15.

Figure 17:
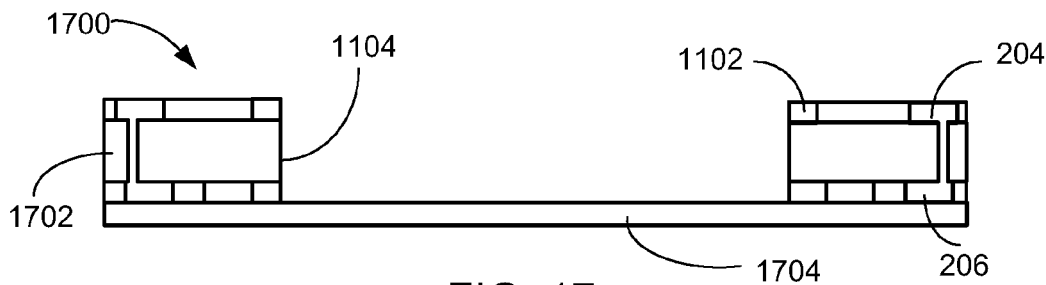
FIG. 17 is a cross-sectional view of a ball grid array assembly in a taping phase of manufacturing.

Referring now to FIG. 17, therein is shown a cross-sectional view of a ball grid array assembly 1700 in a taping phase of manufacturing. The cross-sectional view of the ball grid array assembly 1700 depicts a base structure 1702 having the opening 1104, the bonding contacts 1102, the chip contacts 204, and the board pads 206. A sealing tape 1704, such as a cover lay tape, may be adhered to the bottom surface of the base structure 1702 for properly positioning the base structure device 1300, of FIG. 13, and to prevent the encapsulant 118, of FIG. 1, from leaking to the bottom surface during later manufacturing steps.

Figure 18:
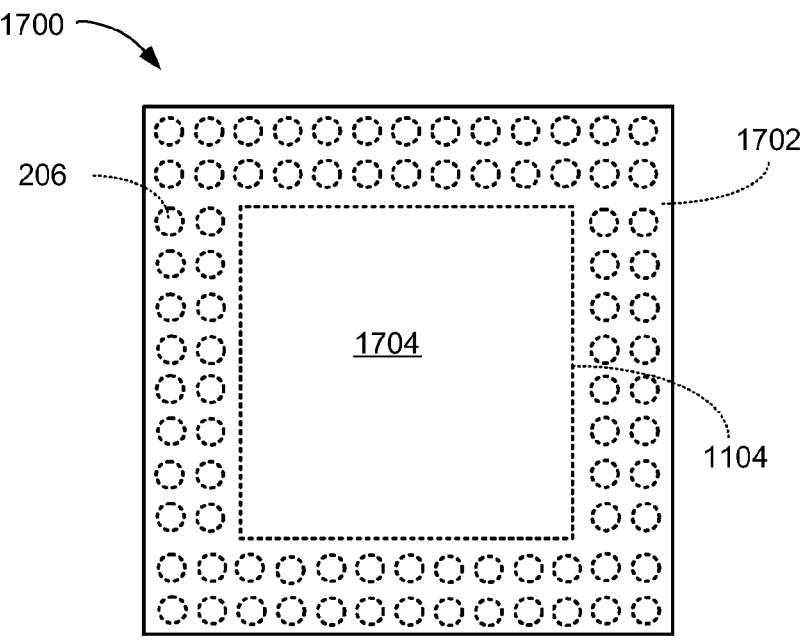
FIG. 18 is a bottom view of the ball grid array assembly, of FIG. 17 in the taping phase of manufacturing.

Referring now to FIG. 18, therein is shown a bottom plan view of the ball grid array assembly 1700, of FIG. 17 in the taping phase of manufacturing. The bottom view of the ball grid array assembly 1700 depicts the base structure 1702 having a double row of the board pads 206. The center region of the base structure 1702 is covered by having the sealing tape 1704 adhered to the base structure 1702 covering the board pads 206 and the opening 1104. The position and number of the board pads 206 is for example only. In the actual implementation, there may be a different number of the board pads 206 in a different configuration.

Figure 19:
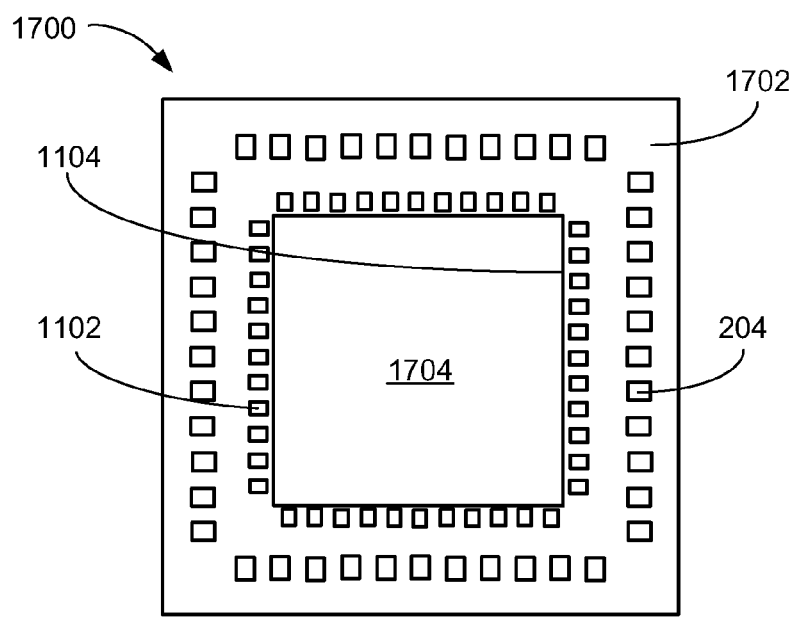
FIG. 19 is a top view of the ball grid array assembly, of FIG. 17 in the taping phase of manufacturing.

Referring now to FIG. 19, therein is shown a top view of the ball grid array assembly 1700, of FIG. 17 in the taping phase of manufacturing. The top view of the ball grid array assembly 1700 depicts the base structure 1702 having an outer row of the chip contacts 204, the opening 1104, and an inner row of the bonding contacts 1102 that are adjacent to the opening 1104. The position and number of the bonding contacts 1102 and the chip contacts 204 are for example only. Their position and number may be different. The size and shape of the opening 1104 are also an example and the opening 1104 may actually be other shapes or sizes.

Figure 20:
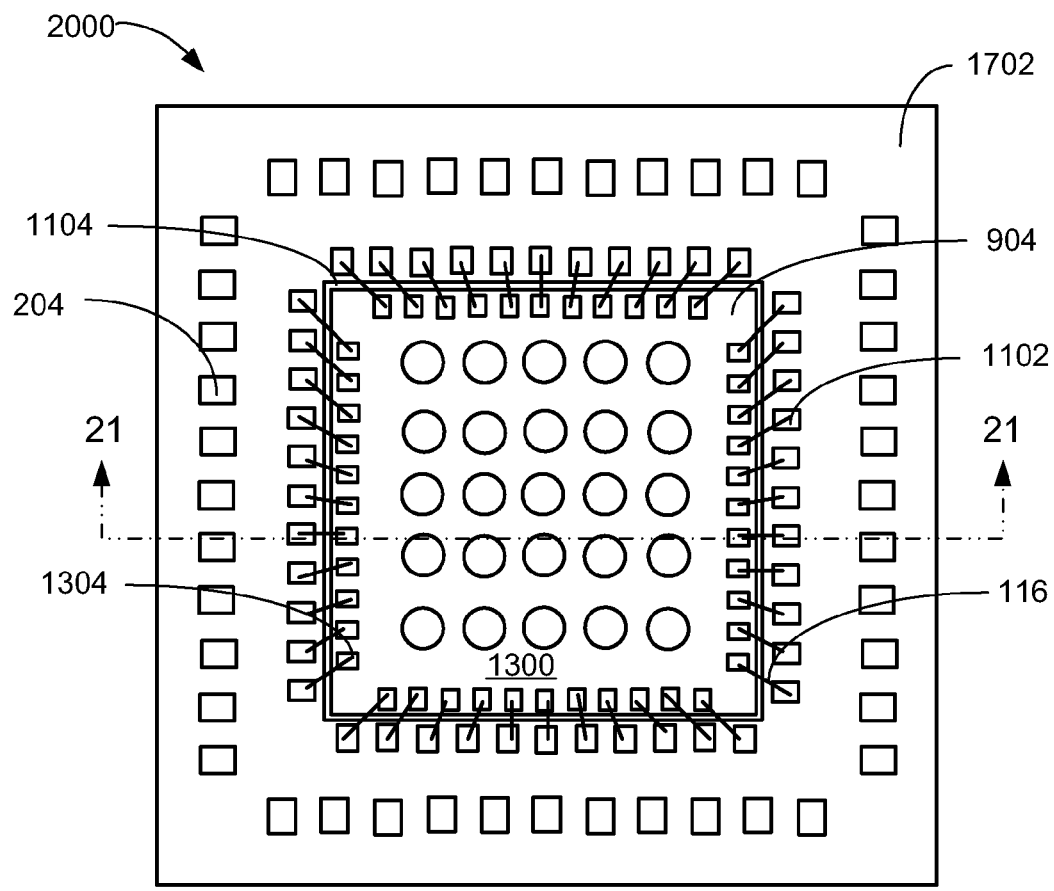
FIG. 20 is a top view of the ball grid array assembly in an ultra thin package assembly phase of manufacturing.

Referring now to FIG. 20, therein is shown a top view of a ball grid array assembly 2000 in the ultra thin package 1300 assembly phase of manufacturing. The top view of the ball grid array assembly 2000 depicts the base structure 1702 having the outer row of the chip contacts 204, the inner row of the bonding contacts 1102, and the opening 1104 in the center of the base structure 1702.

The thin substrate 904 is positioned in the center of the opening 1104. The jumper pads 1304 on the thin substrate 904 may be aligned in a relative proximity to the bonding contacts 1102 on the base structure 1702. The electrical interconnects 116 may couple the jumper pads 1304 to the bonding contacts 1102. The relative position of the bonding contacts 1102 and the jumper pads 1304 is an example only and the actual alignment of the bonding contacts 1102 and the jumper pads 1304 may be different. A segmentation line 21-21 shows the direction of view for a FIG. 21.

Figure 21:
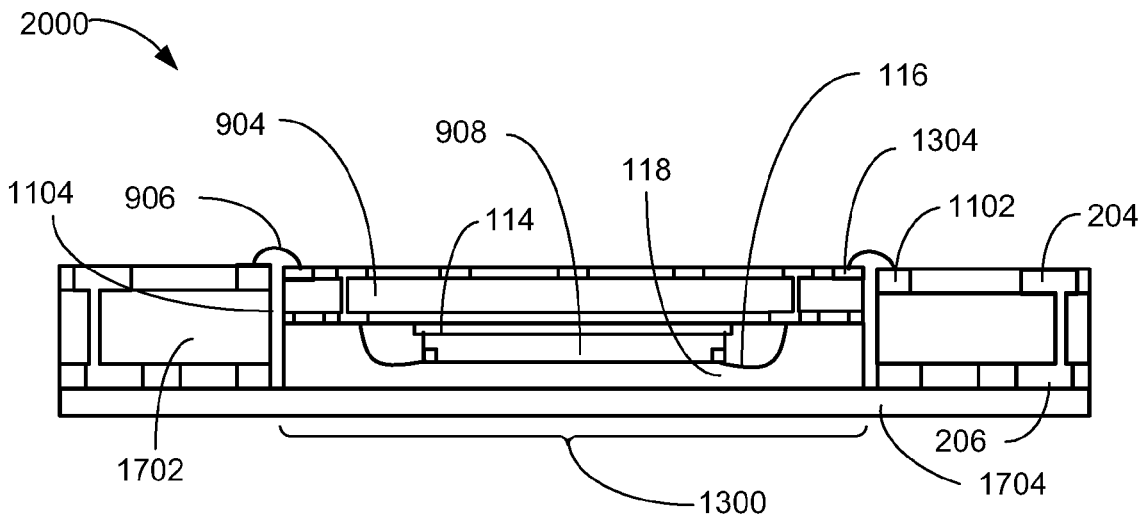
FIG. 21 is a cross-sectional view of the ball grid array assembly along the section line 21-21 of FIG. 20.

Referring now to FIG. 21, therein is shown a cross-sectional view of the ball grid array assembly 2000 along the section line 21-21, of FIG. 20. The cross-sectional view of the ball grid array assembly 2000 depicts the base structure 1702 having the sealing tape 1704 adhered under the opening 1104. The base structure device 1300 is centered in the opening 1104 and adhered to the sealing tape 1704. The encapsulant 118 of the base structure device 1300 is supported by the sealing tape 1704 for establishing a coplanar The bonding contacts 1102 are coupled to the jumper pads 1304 by the interconnect jumpers 906 for forming an electrical continuity from the integrated circuit die 908 through the thin substrate 904. A signal coupled to the bonding contact 1102 may establish an electrical connection to one or more of the chip contacts 204, the board pads 206, or a combination thereof.

Figure 22:
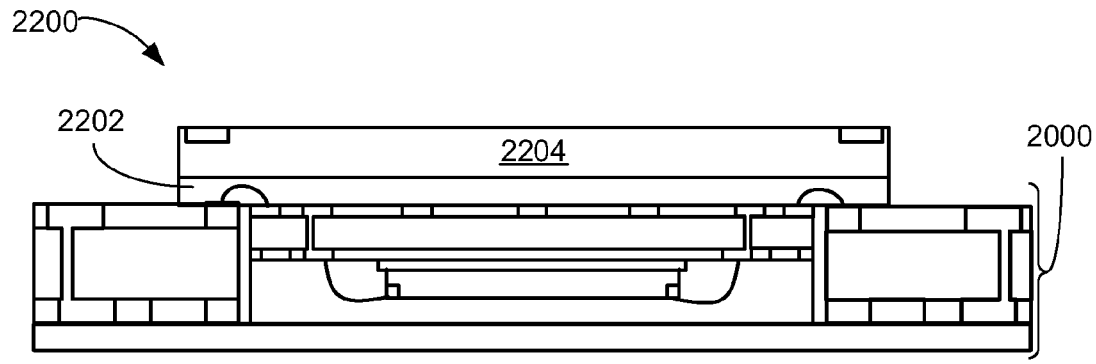
FIG. 22 is a cross-sectional view of a ball grid array assembly in a die attach phase of manufacturing.

Referring now to FIG. 22, therein is shown a cross-sectional view of a ball grid array assembly 2200 in a die attach phase of manufacturing. The cross-sectional view of the ball grid array assembly 2200 depicts the ball grid array assembly 2000, an adhesive layer 2202, such as a film on wire, is on the ball grid array assembly 2000, and an integrated circuit die 2204 may be attached on the adhesive layer 2202. The integrated circuit die 2204 is shown as a wire bond die but this is as an example only. The integrated circuit die 2204 could be other types of devices, such as a flip chip die, or one of the base structure device 102, of FIG. 1.

Figure 23:
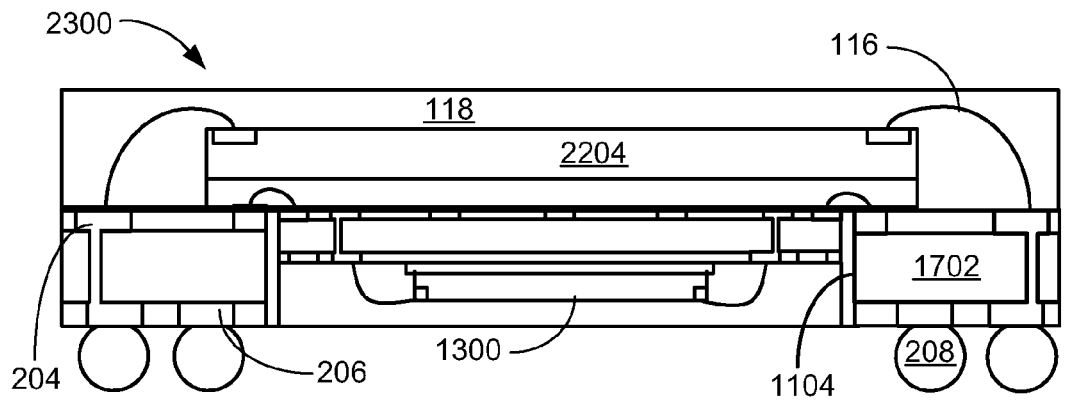
FIG. 23 is a cross-sectional view of a ball grid array package in a finished state of manufacturing.

Referring now to FIG. 23, therein is shown a cross-sectional view of a ball grid array package 2300 in a finished state of manufacturing. The cross-sectional view of the ball grid array package 2300 depicts the ball grid array assembly 2200 having the electrical interconnects 116 coupling the integrated circuit die 2204 to the chip contacts 204.

The encapsulant 118 may be molded on the electrical interconnects 116, the chip contacts 204, the adhesive layer 2202, and the integrated circuit die 2204. The encapsulant may also flow between the base structure device 1300 and the base structure 1702, filling the opening 1104. The sealing tape 1704, of FIG. 17, may be removed and the system interconnects 208, such as solder balls, solder bumps, solder columns, or stud bumps, may be formed on the board pads 206.

Figure 24:
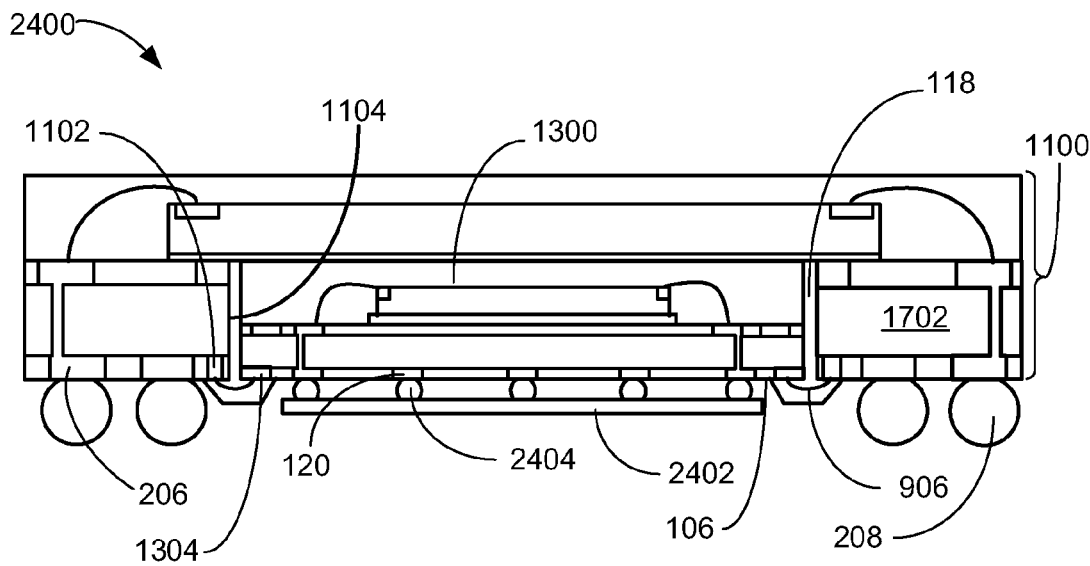
FIG. 24 is a cross-sectional view of a ball grid array package having the base structure device configured top up.

Referring now to FIG. 24, therein is shown a cross-sectional view of a ball grid array package 2400 having the base structure device 1300 configured top up. The cross-sectional view of the ball grid array package 2400 depicts the ball grid array assembly 1100 having the base structure device 1300 mounted in the opening 1104. The base structure device 1300 is mounted having the interface side 106 of the base structure device 1300 coplanar with the board pads 206 of the base structure 1702. The interconnect jumpers 906 electrically connect the jumper pads 1304 of the base structure device 1300 to the bonding contacts 1102 of the base structure 1702.

The encapsulant 118 may be molded between the base structure 1702 and the base structure device 1300 and covers the interconnect jumpers 906. A flip chip die 2402 may be coupled to the interface contacts 120, of the base structure device 1300, by interconnect structures 2404, such as solder balls, solder columns, or stud bumps. The system interconnects 208 may be formed on the board pads 206, for attaching the ball grid array package 2400 to the next level system (not shown). This structure allows for a package that supports more than two integrated circuits in a single package having a vertical height that normally supports only one integrated circuit.

Figure 25:
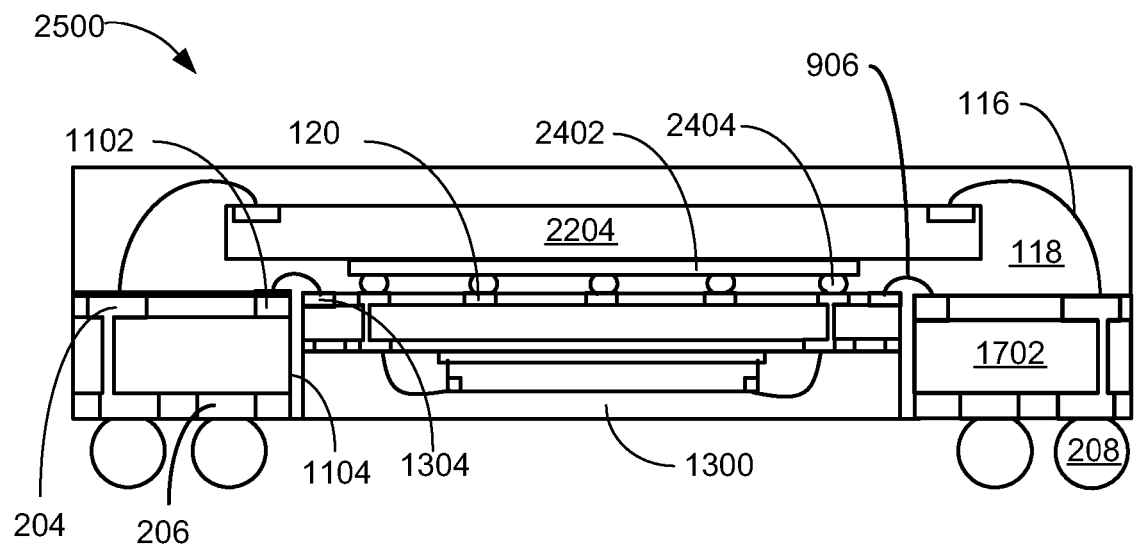
FIG. 25 is a cross-sectional view of a ball grid array package having the base structure device configured top down.

Referring now to FIG. 25, therein is shown a cross-sectional view of a ball grid array package 2500 having the base structure device 1300 configured top down. The cross-sectional view of the ball grid array package 2500 depicts the base structure 1702 having the base structure device 1300 mounted in the opening 1104. The base structure device 1300 may be mounted so that the interface contacts 120, of the base structure device 1300, are coplanar with the chip contacts 204, of the base structure 1702. The interconnect jumpers 906 may electrically connect the jumper pads 1304 of the base structure device 1300 to the bonding contacts 1102 of the base structure 1702.

The flip chip die 2402 may be coupled to the interface contacts 120, of the base structure device 1300, by the interconnect structures 2404, such as solder balls, solder columns, or stud bumps. The integrated circuit die 2204 may be attached over the flip chip die 2402. The electrical interconnects 116 electrically connect the integrated circuit die 2204 to the chip contacts 204, of the base structure 1702.

The encapsulant 118 may be molded on the integrated circuit die 2204, the electrical interconnects 116, the flip chip die 2402, the interconnect structures 2404, the base structure device 1300, the interconnect jumpers 906, and the base structure 1702. The encapsulant 118 may also fill the opening 1104 between the base structure 1702 and the base structure device 1300. The system interconnects 208 may be formed on the board pads 206 of the base structure 1702.

Figure 26:
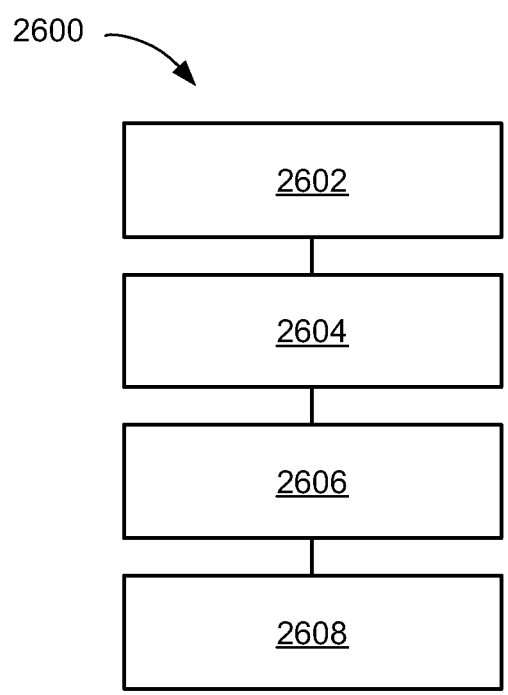
FIG. 26 is a flow chart of an integrated circuit packaging system for manufacturing the integrated circuit packaging system with thin profile in an embodiment of the present invention.

Referring now to FIG. 26, therein is shown a flow chart of an integrated circuit packaging system 2600 for manufacturing the integrated circuit packaging system 100 with thin profile in an embodiment of the present invention. The system 2600 includes forming a base structure, having an opening in a block 2602; mounting a base structure device in the opening in a block 2604; attaching an integrated circuit die over the base structure device in a block 2606; and molding an encapsulant on the base structure, the base structure device, and the integrated circuit die in a block 2608.

It has been discovered that the present invention thus has numerous aspects.

A principle aspect is that the present invention provides a multi-function package in package having the same vertical height and foot print as a single chip package.

Another aspect is a very high manufacturing yield percentage is possible due to the assembly of pre-tested packages.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit packaging system with thin profile of the present invention furnishes important and heretofore unknown and unavailable solutions, capabilities, and functional aspects for packaging multiple functional devices in a package without increasing the vertical height of the package. The resulting processes and configurations are straightforward, cost-effective, uncomplicated, highly versatile and effective, can be surprisingly and unobviously implemented by adapting known technologies, and are thus readily suited for efficiently and economically manufacturing package-in-package devices fully compatible with conventional manufacturing processes and technologies. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit packaging system comprising:
   forming a base structure having an opening, the base structure device including a substrate, integrated circuit die on one side of the substrate, and an interface contact on a side of the substrate opposite the integrated circuit die;
   mounting a base structure device including a first encansulant in the opening;
   attaching an integrated circuit device over the base structure device; and
   molding a second encapsulant on the base structure, the base structure device, and the integrated circuit device.

2. The system as claimed in claim 1 wherein forming the base structure includes forming the opening in a quad flatpack no-lead lead frame or a ball grid array substrate.

3. The system as claimed in claim 1 further comprising:
   coupling an electrical interconnect between the integrated circuit device and the base structure; and
   forming an interconnect jumper between the base structure device and the base structure.

4. The system as claimed in claim 1 further comprising attaching a flip chip die to the base structure device.

5. The system as claimed in claim 1 wherein mounting the base structure device mounts the base structure device having a thickness equal to or less than a thickness of the base structure.

6. An integrated circuit packaging system comprising:
   forming a base structure, having an opening including forming a bonding contact on the base structure;
   mounting a base structure device including a first encapsulant in the opening of the base structure including aligning a board contact for being coplanar with the base structure device, the base structure device including a substrate, integrated circuit die on one side of the substrate, and an interface contact on a side of the substrate opposite the integrated circuit die;
   attaching an integrated circuit device over the base structure device including attaching an adhesive layer between the base structure device and the integrated circuit device; and
   molding a second encapsulant on the base structure, the base structure device, and the integrated circuit device including forming a package in package.

7. The system as claimed in claim 6 wherein forming the base structure includes forming a quad flatpack no-lead lead frame or a ball grid array substrate having the opening in which having the opening includes having a generally similar shape to the base structure device.

8. The system as claimed in claim 6 further comprising:
   coupling an electrical interconnect between the integrated circuit device and the base structure including providing a chip contact on the base structure; and
   forming an interconnect jumper between the base structure device and the base structure including coupling a jumper pad, on the base structure device, to the bonding contact on the base structure.

9. The system as claimed in claim 6 further comprising attaching a flip chip die to the base structure device including forming an interconnect structure on the flip chip die.

10. The system as claimed in claim 6 further comprising providing a package thickness of the base structure device in a range of 0.2 to 0.3 millimeter in which providing the package thickness of the base structure device is about equal to a substrate height.

11. An integrated circuit packaging system comprising:
    a base structure, having an opening;
    a base structure device including a first encapsulant mounted in the opening, the base structure device including a substrate, integrated circuit die on one side of the substrate, and an interface contact on a side of the substrate opposite the integrated circuit die;
    an integrated circuit device over the base structure device; and
    a second encapsulant molded on the base structure, the base structure device, and the integrated circuit device.

12. The system as claimed in claim 11 wherein the base structure includes the opening in a quad flatpack no-lead lead frame or a ball grid array substrate.

13. The system as claimed in claim 11 further comprising:
    an electrical interconnect between the integrated circuit device and the base structure; and
    an interconnect jumper between the base structure device and the base structure.

14. The system as claimed in claim 11 further comprising a flip chip die attached to the base structure device.

15. The system as claimed in claim 11 wherein the base structure device has a thickness equal to or less than a thickness of the base structure.

16. The system as claimed in claim 11 further comprising:
a bonding contact on the base structure;
a board contact coplanar with the base structure device;
an adhesive layer between the base structure device and the integrated circuit device; and
a package in package formed by the encapsulant.

17. The system as claimed in claim 16 wherein the base structure includes a quad flatpack no-lead lead frame or a ball grid array substrate having the opening in which the opening has a generally similar shape to the base structure device.

18. The system as claimed in claim 16 further comprising:
an electrical interconnect between the integrated circuit device and the base structure includes a chip contact on the base structure; and
an interconnect jumper between the base structure device and the base structure includes a jumper pad, on the base structure device, coupled to the bonding contact on the base structure.

19. The system as claimed in claim 16 further comprising a flip chip die coupled to the base structure device includes an interconnect structure on the flip chip die.

20. The system as claimed in claim 16 further comprising a package thickness of the base structure device in a range of 0.2 to 0.3 millimeter in which the package thickness of the base structure device is about equal to a substrate height.

* * * * *